United States Patent [19]

Yoshida et al.

[11] Patent Number: 5,630,014

[45] Date of Patent: May 13, 1997

[54] GAIN CONTROLLER WITH AUTOMATIC ADJUSTMENT USING INTEGRATION ENERGY VALUES

[75] Inventors: Toshio Yoshida; Mititaka Sisido, both of Tokyo, Japan

[73] Assignee: NEC Corporation, Tokyo, Japan

[21] Appl. No.: 330,387

[22] Filed: Oct. 27, 1994

[30] Foreign Application Priority Data

Oct. 27, 1993 [JP] Japan .................................. 5-268615

[51] Int. Cl.⁶ .................................................. G10L 9/00
[52] U.S. Cl. ................................. 395/2.34; 395/2.35
[58] Field of Search ............................. 395/2.34, 2.35

[56] References Cited

U.S. PATENT DOCUMENTS

| | | | |
|---|---|---|---|
| 4,110,460 | 8/1978 | Leary et al. | 379/339 |
| 4,331,837 | 5/1982 | Soumagne | 395/35 |
| 4,532,648 | 7/1985 | Noso et al. | 395/34 |
| 4,630,305 | 12/1986 | Borth et al. | 395/35 |
| 5,267,322 | 11/1993 | Smith et al. | 395/34 |
| 5,274,711 | 12/1993 | Rutledge et al. | 395/34 |
| 5,459,814 | 10/1995 | Gupta et al. | 395/34 |

*Primary Examiner*—Allen R. MacDonald
*Assistant Examiner*—Vijay B. Chawan
*Attorney, Agent, or Firm*—Sughrue, Mion, Zinn, Macpeak & Seas

[57] ABSTRACT

A gain controller for use in mobile telephone system is disclosed. It is judged whether digital input data includes speech data or not. When the digital input data includes speech data, an integration energy value of the digital speech data for a predetermined time length is measured. The measured integration energy value is compared with a higher threshold value and a lower threshold value. A step level is set to a predetermined minus value, a predetermined plus value and "0" when the integration energy value is higher than the higher threshold value, lower than the lower threshold value and within a range between the higher and lower threshold values, respectively. The obtained step level is then added to the digital speech data.

4 Claims, 3 Drawing Sheets

GAIN CONTROLLER WITH AUTOMATIC ADJUSTMENT USING INTEGRATION ENERGY VALUES

BACKGROUND OF THE INVENTION

The present invention relates to a gain controller and, more particularly, to a gain controller used in a mobile telephone receiving system.

FIG. 3 shows a prior art mobile telephone receiving system. The system comprises an antenna 1, a radio unit 2, a digital signal processor (hereinafter referred to as DSP) 30, a DSP controller 70, a digital-to-analog converter 8, a volume resistor 9, a receiver amplifier 10, and a receiver 11. The DSP 30 includes a channel decoder 40 and a speech decoder 50. In FIG. 3, digital data received through the antenna 1 and decoded by the radio unit 2 comprises speech data and control data for each frame having a predetermined time length (for instance 90 msec). The decoded data from the radio unit 2 is decoded for each frame in the channel decoder 40 of the DSP 30 and the speech data in the frame is decoded to obtain digital speech data for the speech decoder 50. The digital speech data obtained by the speech decoder 50 is converted into analog signal by the digital/analog converter 8, then the level thereof is adjusted by the volume resistor 9, and the digital speech data is amplified by the receiver amplifier 10 to reproduce the speech by the receiver 11, such as a speaker. DSP controller 70 controls the operation of the DSP 30.

In such a prior art structure, it is only the volume resistor 9 that can control the sound level in the receiving system.

Japanese Patent Laid-Open Publication No. 123130/1991 discloses a hand-free car telephone system, which has means for controlling the volume from a speaker according to the running speed of the car. FIG. 4 is a block diagram showing this system. Referring to FIG. 4, the car telephone system 18 includes a handset 17, a microphone 16 to be used in hand-free communication, a volume control means 13 for controlling the speaker volume, and a telephone control means 12 for controlling the above car telephone system components. Car telephone system radio means 2 connects the car telephone system 18 with a base station (not shown in FIG. 4) via a radio line. During communication, a signal corresponding to the car running speed is supplied from speed detection means 14 to the volume control means 13 to control the volume from the speaker 15. Thus, the driver can continue communication without need of controlling the volume irrespective of ambient noise variations with running speed changes.

SUMMARY OF THE INVENTION

In the former prior art system, however, the receiving system volume fluctuates extremely greatly due to fluctuations of the gain of the connection line, transmitting system sensitivity at opposite terminal, talker's speaking volume at opposite terminal, etc. Such volume fluctuations sometimes could have not been covered by the sole volume resistor 9 at receiving side. The latter prior art system, although having the function of automatically controlling the receiving system volume according to the car running speed or ambient noise level, is ineffective with respect to the receiving side volume changes caused by the connection line and opposite terminal.

It is therefore an object of the present invention to provide a gain controller capable of selective and smooth control at an appropriate level, thus precluding the sense of hard of hearing.

It is another object of the present invention to provide a gain controller capable of precluding the sense of distortion.

According to one aspect of the present invention, there is provided a gain controller comprising, judging means for judging whether digital input data includes speech data or not; measuring means, when the digital input data includes speech data, for measuring an integration energy value of the digital speech data for a predetermined time length; comparison means for comparing the measured integration energy value with a higher threshold value and a lower threshold value; setting means for setting a step level to a predetermined minus value, a predetermined plus value and "0" when the integration energy value is higher than the higher threshold value, lower than the lower threshold value and within a range between the higher and lower threshold values, respectively; and adding means for adding the step level to the digital speech data.

According to another aspect of the present invention, there is provided a gain controller comprising, antenna means for receiving a radio modulated digital data signal comprising speech data and control data for a predetermined time length; a radio unit means for decoding the signal supplied from the antenna means and producing the modulated digital data; a channel decoder means for separating the digital data from the radio unit means into speech data and control data; judging means for judging whether digital input data includes speech data or not; measuring means, when the digital input data includes speech data, for measuring an integration energy value of the digital speech data for a predetermined time length; comparison means for comparing the measured integration energy value with a higher threshold value and a lower threshold value; setting means for setting a step level to a predetermined minus value, a predetermined plus value and "0" when the integration energy value is higher than the higher threshold value, lower than the lower threshold value and within a range between the higher and lower threshold values, respectively; and adding means for adding the step level to the digital speech data; D/A converter means for converting the speech data from the adding means into analog speech signal; amplifying means for amplifying the analog speech signal; and speech reproducing means for reproducing speech sound based upon the amplified speech signal.

Other objects and features will be clarified from the following description with reference to attached drawings.

DETAILED DESCRIPTION OF THE PREFERRED EMBODIMENTS

Figure 1:
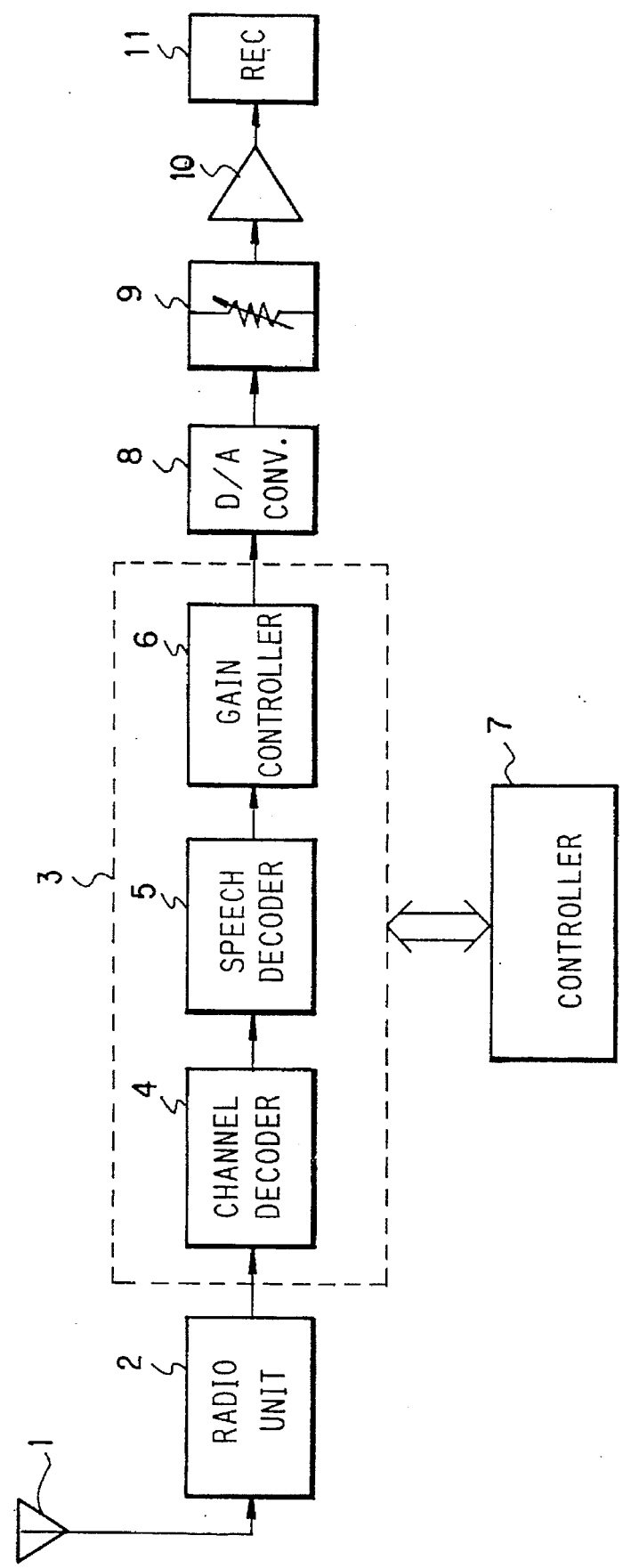
FIG. 1 is a block diagram of a gain controller according to an embodiment of the present invention.

The present invention will now be described with reference to the drawings. FIG. 1 shows an embodiment of the present invention. The embodiment comprises an antenna 1, a radio unit 2, a DSP controller 7, a digital-to-analog converter 8, a variable volume resistor 9, a receiver amplifier 10 and a receiver 11. These components are the same as those in the prior art and therefore not described. The embodiment further comprises a DSP 3 which includes a channel decoder 4, a speech decoder 5 and a gain controller 6. The channel decoder 4 has the same function as in the prior art. The speech decoder 5 has functions added to the prior art speech decoder, these functions being for executing such processes as regression analysis of signals, judgment of speech signals, measurement of frame energy and integration of frame energy. The gain controller 6 automatically controls the receiving system interface level to a proper level according to the result of the frame energy integration in the speed decoder 5. The DSP 3 is controlled by a DSP controller 7 which is provided with DSP control software.

Figure 2:
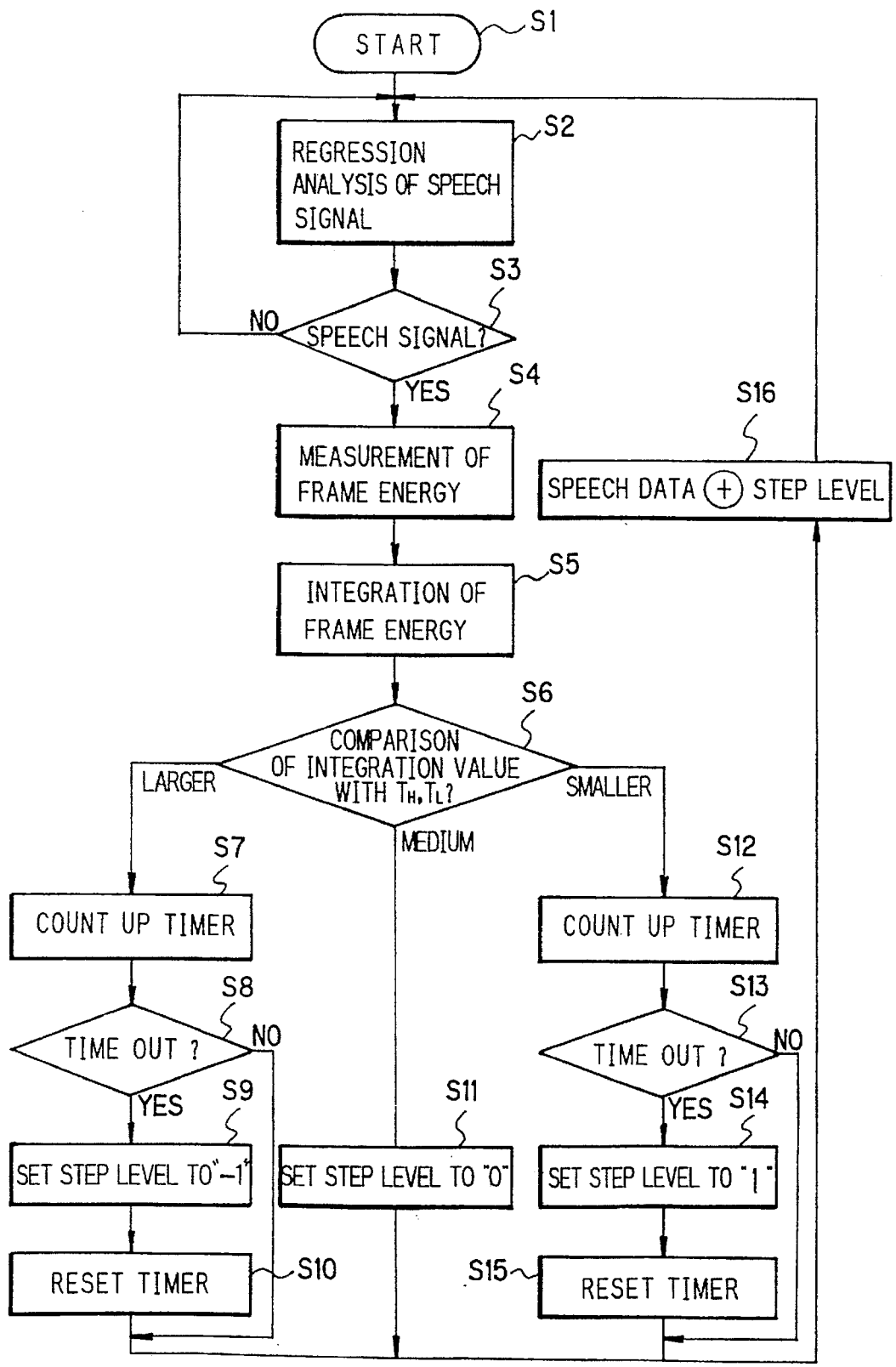
FIG. 2 is a flowchart showing processes of the embodiment of FIG. 1.
Figure 3:
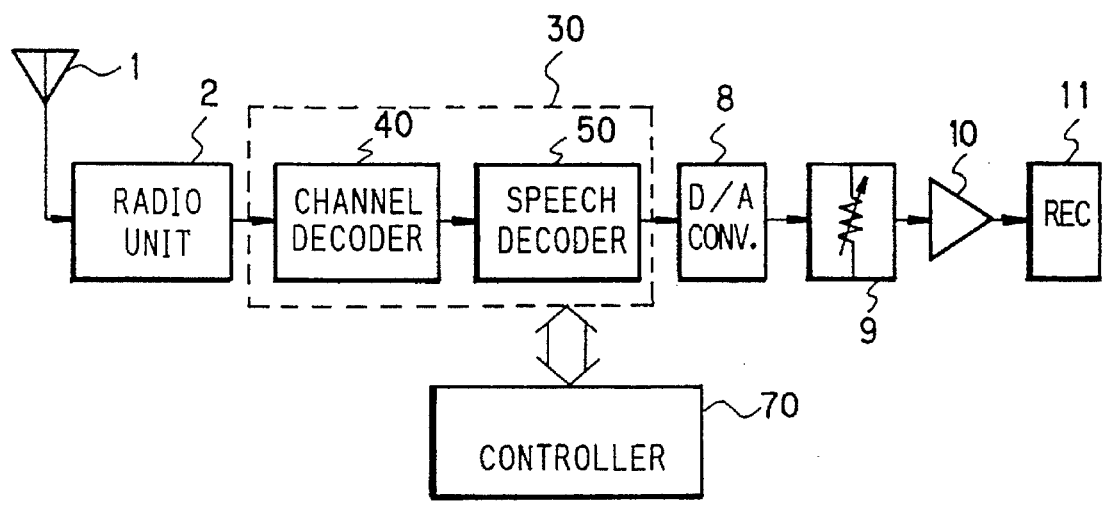
FIG. 3 is a block diagram of the conventional gain controller.
Figure 4:
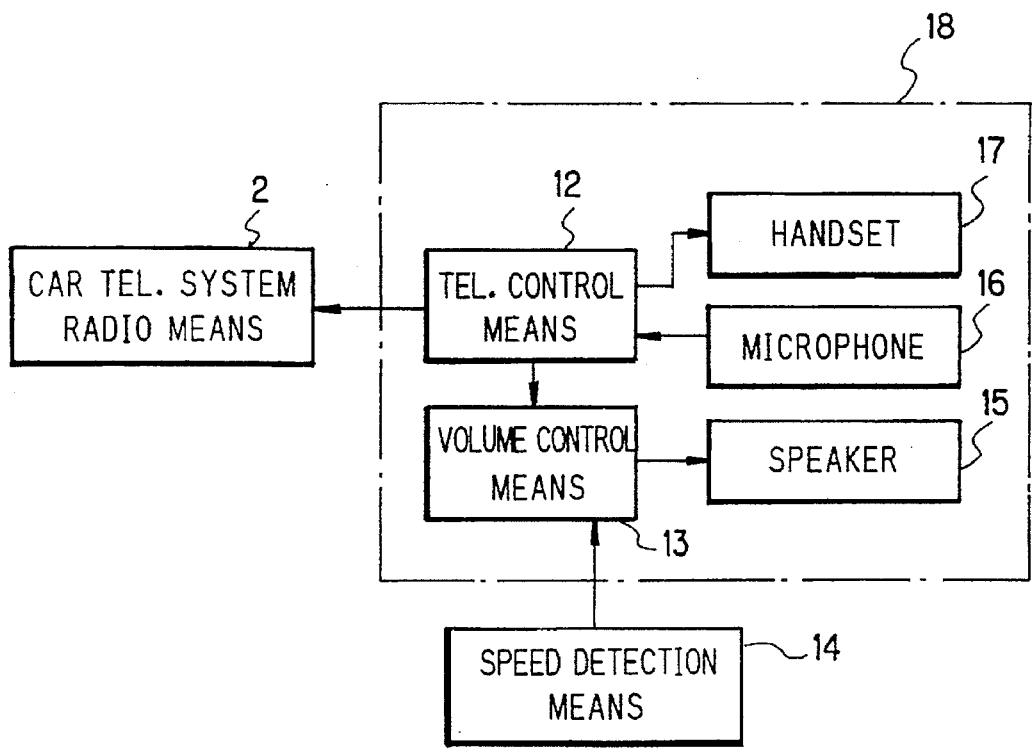
FIG. 4 is another block diagram of the conventional gain controller.

FIG. 2 is a flow chart illustrating the operation of the DSP 3.

In response to a start of the speech decoding process (step S1), the regression strength of the speech data supplied from the channel decoder 4 is analyzed (step S2). The regression implies a repetition. The speech data usually has high repetitive characteristic, that is, strong regression. On the other hand, noise is random and has low regression. Therefore, the judgment whether the input data is speech data or not may be executed based upon the regression strength. In step S3, the input data is Judged whether it is the speech data or not based upon the regression strength. Here, the input data such as howling and tone signals have abnormally strong regression and therefore in order to discriminate the difference between the signals of such abnormal signals and the speech data, two different threshold levels are provided. When the regression strength is within the range between the two threshold levels, the input data is judged to be speech data, and when the regression strength is higher than the higher threshold level, the input data is Judged to be the abnormal one.

In the step S3, when the input data is not the speech, the routine returns to the step S2 and when the input is speech, a frame energy over a plurality of number of frames or a predetermined time length such as several hundred msec is measured (step S4). This measurement of the frame energy is, usually, executed for the predetermined time length i.e. a plurality of frames included in the time length of several hundred milliseconds.

In step S5, the frame energy obtained in the step S4 is integrated. This integration is an accumulation processing of the previously obtained frame energy.

The obtained integration value of the frame energy is then compared with the higher threshold level TH and lower threshold level TL in a step S6. As a result of the comparison, when the integration value is higher than TH, lower than TL processing within the range between TH and TL, the judgement results "large", "small" and "medium" are produced, respectively, and the subsequent processes are executed.

In response to the comparison result as "large", timer count up operation starts (step S7). The set time of the timer is typically several seconds set to discriminate the speech signal stable in relatively long time, not instantaneous. Next, it is judged whether the set time of the timer has elapsed (step S8) or the completion of the timeout. If the timeout is completed, "−1" is set as a step level (step S9), then reset the timer (step S10). After resetting the timer, or when the timeout is not completed in the step S8, the process goes to step S16 for adding the above set step level to the speech data and returns to the step S2.

In the step S6, when the integration value of the frame energy is judged as "medium", the step level is set to "0" (step S11), then goes to the step S16 The step level "−1", "1" and "0" may be arbitrarily selected values which represent predetermined minus value, plus value and 0.

When the integration value of the frame energy is Judged as "small", the timer count up operation starts (step S12) similar to the processes of the step S7 and S8, the timeout is Judged (step S13). In the step S13, when it is Judged as "not timeout" the routine goes to the step S16 and when judged as "timeout", "1" is set as the step level (step S14). After that, the timer is reset (step S15) and the process of the step S16 is executed.

In the foregoing, the step level "1" and "−1" correspond to the increase of the level by 1db and the decrease of the level by 1 dB, thereby adjusting the level of the digital speech data through the step S16.

Through repetition of the foregoing routine, the level of the speech data supplied from the channel decoder 4 may be adjusted within the predetermined range defined by the threshold levels TH and TL. In other words, when the received speech data level is lower than TL and it is hard to recognize the speech, the step level is set to "1" in the step S14, thereby increasing the speech data level by 1 dB through the step S16. On the other hand, when the received speech data level is higher than TH, the step level is set to "−1" in the step S9, thereby decreasing the speech data level by 1 dB. According to the above processing the received speech data level may be adjusted at the appropriate level between the threshold levels TH and TL.

In FIG. 1, the processes of the speech decoder 5 and the gain controller 6 correspond to those of FIG. 2. Because the gain control is automatic, as discussed earlier, manual gain control is not essential, and therefore the volume resistor 9 may be optionally omitted.

In the foregoing embodiments, the analysis judgement whether the input signal is the speech signal or not is executed based upon the regression strength. However, this judgement may be executed based upon other known method.

As has been described in the foregoing, according to the present invention, when the speech output in the receiving system is reduced in level to be below a certain level so that it is hard to hear, the level is selectively and smoothly increased to, and then fixed at a proper level, thus precluding the sense of hard of hearing. Also, when the speech output is increased in level beyond a certain level to produce a sense of distortion at peaks depending on the volume position, the level is selectively and smoothly reduced to and then fixed at the proper level, thus precluding the sense of distortion.

What is claimed is:

1. A gain controller comprising:

judging means for Judging whether digital input data includes speech data or not;

measuring means, when the digital input data includes speech data, for measuring an integration energy value of the digital speech data for a predetermined time length;

comparison means for comparing the measured integration energy value with a higher threshold value and a lower threshold value;

setting means for setting a step level to a predetermined minus value, a predetermined plus value and "0" when the integration energy value is higher than the higher threshold value, lower than the lower threshold value and within a range between the higher and lower threshold values, respectively; and adding means for adding the step level to the digital speech data.

2. A gain controller as set forth in claim 1, wherein said judgement means is executed based upon a regression strength of the speech data.

3. A gain controller comprising:

antenna means for receiving a radio modulated digital data comprising speech delta and control data for a predetermined time length;

a radio unit means for decoding the signal supplied from said antenna means and producing the modulated digital data;

a channel decoder means for separating the digital data from said radio unit means into speech data and control data;

judging means for judging whether digital input data includes speech data or not;

measuring means, when the digital input data includes speech data, for measuring an integration energy value of the digital speech data for a predetermined time length;

comparison means for comparing the measured integration energy value with a higher threshold value and a lower threshold value;

setting means for setting a step level to a predetermined minus value, a predetermined plus value and "0" when the integration energy value is higher than the higher threshold value, lower than the lower threshold value and within a range between the higher and lower threshold values, respectively;

adding means for adding the step level to the digital speech data;

D/A converter means for converting the speech data from said adding means into an analog speech signal;

amplifying means for amplifying the analog speech signal; and speech reproducing means for reproducing speech sound based upon the amplified speech signal.

4. A gain controller as set forth in claim 3, further comprising a volume adjusting means, provided between said amplifying means and said speech reproducing means, for adjusting the level of the speech signal.

* * * * *